United States Patent [19]
Jones

[11] Patent Number: 5,114,745
[45] Date of Patent: May 19, 1992

[54] METHOD OF PRODUCING A THIN CARBIDE LAYER ON A CARBON SUBSTRATE, GROWING A DIAMOND OR DIAMOND-LIKE FILM ON THE CARBIDE LAYER, AND REMOVING THE CARBON SUBSTRATE

[76] Inventor: Barbara L. Jones, 80 Chisbury Place, Forest Park, Bracknell, RG12 3TX, England

[21] Appl. No.: 530,658

[22] Filed: May 30, 1990

[30] Foreign Application Priority Data

May 31, 1989 [GB] United Kingdom ............... 8912498

[51] Int. Cl.⁵ .......................... B05D 5/12; B05D 3/06
[52] U.S. Cl. ...................................... 427/113; 427/38; 427/249; 427/255.2; 427/355; 427/419.7; 156/DIG. 68
[58] Field of Search ............... 427/38, 39, 249, 419.7, 427/113, 255.2, 355; 156/DIG. 68

[56] References Cited

U.S. PATENT DOCUMENTS

| | | | |
|---|---|---|---|
| 4,434,188 | 2/1984 | Komo et al. | 427/113 |
| 4,707,384 | 11/1987 | Schachner et al. | 427/255 |
| 4,987,002 | 1/1991 | Sakomoto et al. | 427/34 |
| 5,023,068 | 6/1991 | Jones | 156/DIG. 68 |

FOREIGN PATENT DOCUMENTS 61-106494 5/1986 Japan.
61-151097 7/1986 Japan.
2175696 7/1990 Japan.

Primary Examiner—Shrive Beck
Assistant Examiner—Benjamin L. Utech
Attorney, Agent, or Firm—Scully, Scott, Murphy & Presser

[57] ABSTRACT

A method of producing a diamond or diamond-like film having a desired profile which involves providing a solid carbon substrate having a surface shaped to the desired profile, creating a thin carbide layer on the profiled surface growing a diamond or diamond-like film on the carbide layer, removing the carbon substrate and optionally also removing the carbide layer.

7 Claims, 1 Drawing Sheet

# METHOD OF PRODUCING A THIN CARBIDE LAYER ON A CARBON SUBSTRATE, GROWING A DIAMOND OR DIAMOND-LIKE FILM ON THE CARBIDE LAYER, AND REMOVING THE CARBON SUBSTRATE

BACKGROUND OF THE INVENTION

This invention relates to diamond growth.

Various methods have been proposed and tried for growing diamond on diamond seed crystals by chemical vapour deposition (CVD) using gaseous carbon compounds such as hydrocarbons or carbon monoxide. A gaseous compound can be produced from a liquid carbon compound such as an alcohol or acetone. The gaseous carbon compounds may be decomposed by various methods including the use of heat and radio frequency (RF) energy, and also by means of microwave energy.

Examples of patents directed to methods of growing diamonds on substrates are U.S. Pat. Nos. 4,434,188 and 4,734,339 and European Patent Publications Nos. 288065, 327110, 305903 and 286306.

European Patent Publication No. 0348026 describes a method of growing crystalline diamond on a substrate which includes the steps of providing a surface of a suitable nitride, placing the substrate on the nitride surface, creating an atmosphere of a gaseous carbon compound around the substrate, bringing the temperature of the nitride surface and the substrate to at least 600° C., and subjecting the gaseous carbon compound to microwave energy suitable to cause the compound to decompose and produce carbon which deposits on the substrate and forms crystalline diamond thereon. The nitride is typically silicon nitride and the frequency of the microwave is typically in the range 200 MHz to 90 GHz.

SUMMARY OF THE INVENTION

According to the present invention, a method of producing a diamond or diamond-like film of a desired profile includes the steps of providing a solid substrate having a surface shaped to the desired profile, producing a thin carbide layer on the profiled surface, growing a diamond or diamond-like film on the carbide layer, removing the substrate and optionally removing the carbide layer.

DESCRIPTION OF EMBODIMENTS

The solid substrate will be made of a material which can easily be formed into a desired shape and which is inert to microwave or like energy. Examples of suitable materials are silicon nitride and, preferably, carbon, e.g. graphite.

The carbide layer will be thin and generally less than 20 microns in thickness. Preferably, the thickness of the layer will be less than 5 microns. The layer will thus follow closely the profile of the shaped surface.

The carbide layer will preferably be a carbide of a high melting metal such as titanium, hafnium, zirconium, molybdenum, tantalum or the like. This layer is preferably formed by first depositing a layer of the metal, for example by evaporation, on the shaped surface and thereafter exposing the metal layer to an atmosphere containing carbon plasma to convert the metal to a carbide.

The diamond or diamond-like film which is grown on the carbide layer by chemical vapour deposition such as that described in European Patent Publication No. 0348026. The layer which will generally be polycrystalline in nature.

The solid substrate and/or carbide layer may be removed by machining, milling or etching, or a combination of such methods.

The invention produces a profiled diamond or diamond-like film which has a large surface area and which is thin. The thickness of the diamond or diamond-like film will generally be less than 100 microns. The film will, of course, have a major surface and this surface will generally have an area of at least 10 mm$^2$. The film can be any one of a variety of shapes such as curved, convoluted, and the like.

The diamond or diamond-like film may be left bonded to the thin carbide layer. In this form it is essentially free standing. Alternatively, the carbide layer may be removed producing a diamond or diamond-like film which is completely free standing.

Figure 1:
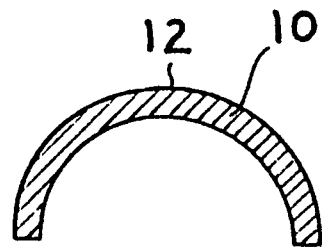
FIGS. 1, 2, 3, 4, and 5 illustrate schematically the various steps of an embodiment of the method of the invention.
Figure 2:
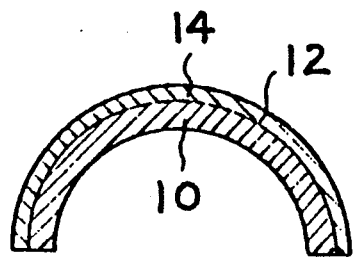

An embodiment of the invention will now be described with reference to the accompanying drawings. Refering to these drawings, each figure represents a separate and successive stage in the method of the present invention. The first stage, second stage, third stage, fourth stage, and fifth stage are respectively shown in FIG. 1, FIG. 2, FIG. 3, FIG. 4 and FIG. 5. There is shown in FIG. 1 a graphite substrate 10 having a curved, semi-circular upper surface 12. As shown in FIG. 2, a layer 14 of titanium is evaporated on to the curved surface 12. Typically, this layer 14 will have a thickness of less than 5 microns. Because of the thinness of this layer, it follows closely the profile of the surface 12.

Figure 3:
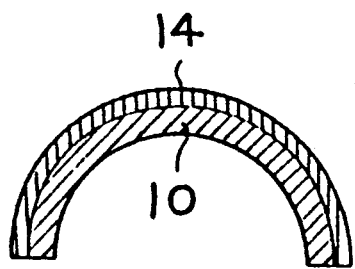

The titanium layer is converted to titanium carbide as shown in FIG. 3. This is achieved by exposing the coated graphite substrate 10 to microwave energy in the presence of a mixture of methane and hydrogen, the methane constituting 15% to 80%, preferably 50%, by volume of the mixture. The methane decomposes to produce carbon plasma which reacts with the titanium to form titanium carbide.

Figure 4:
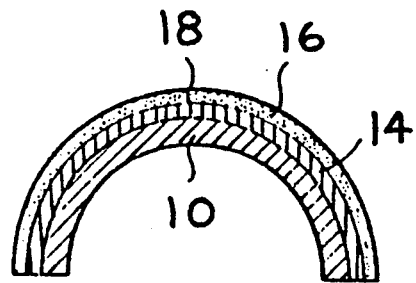

Then, as shown in FIG. 4, a diamond film 16 is grown on the upper curved surface 18 of the titanium carbide layer 14 by any known method of producing a diamond film on a substrate by chemical vapour deposition.

Figure 5:
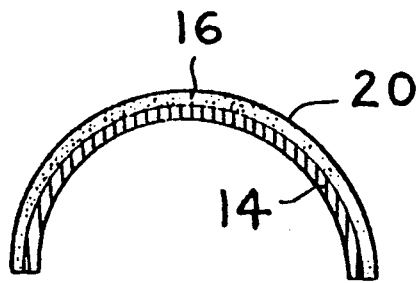

As shown in FIG. 5, the graphite substrate is machined or etched away leaving a diamond film 16 on a thin titanium carbide backing 14. This diamond film is essentially free-standing. The titanium carbide backing 14 can be removed, for example by milling, plasma etching or chemical digestion to produce a diamond film which is completely free-standing.

The diamond film will typically have a thickness of less than 100 microns and its upper surface 20 will typically have an area of at least 10 mm$^2$.

I claim:

1. A method of producing a diamond or diamond-like film having a desired profile includes the steps of providing a solid carbon substrate having a surface shaped to the desired profiled, producing a thin carbide layer on the profiled surface, growing a diamond or diamond-like film on the carbide layer and removing the substrate, wherein the solid substrate and/or carbide layer are removed by a method selected from machining, milling, etching and a combination thereof.

2. A method according to claim 1 wherein the carbide layer is also removed.

3. A method according to claim 1 wherein the substrate is a graphite substrate.

4. A method according to claim 1 wherein the carbide is a carbide of a high melting metal selected from titanium, hafnium, zirconium, molybdenum and tantalum.

5. A method according to claim 1 wherein the carbide layer has a thickness of less than 20 microns.

6. A method according to claim 1 wherein the carbide layer has a thickness of less than 5 microns.

7. A method according to claim 1 wherein the diamond or diamond-like film is grown on the carbide layer by chemical vapour deposition.

* * * * *